US006777642B2

(12) United States Patent
Song et al.

(10) Patent No.: US 6,777,642 B2
(45) Date of Patent: Aug. 17, 2004

(54) METHOD AND APPARATUS FOR CLEANING SURFACES

(75) Inventors: Wendong Song, Singapore (SG); Minghui Hong, Singapore (SG); Boris Lukiyanchuk, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 10/338,975

(22) Filed: Jan. 9, 2003

(65) Prior Publication Data

US 2004/0020905 A1 Feb. 5, 2004

(30) Foreign Application Priority Data

Jul. 31, 2002 (SG) ............................ 200204608-4

(51) Int. Cl.[7] ............................................. B23K 26/00
(52) U.S. Cl. ........................... 219/121.68; 219/121.85
(58) Field of Search ................... 219/121.68, 121.69, 219/121.85, 121.84, 121.61, 121.6, 121.72, 121.78; 134/1, 2; 210/748; 148/DIG. 17

(56) References Cited

U.S. PATENT DOCUMENTS

| | | | | |
|---|---|---|---|---|
| 3,503,804 A | * | 3/1970 | Schneider | 134/1 |
| 4,980,536 A | | 12/1990 | Asch et al. | 219/121.68 |
| 5,043,556 A | * | 8/1991 | Aono et al. | 219/121.72 |
| 5,116,227 A | * | 5/1992 | Levy | 433/216 |
| 5,151,135 A | | 9/1992 | Magee et al. | 134/1 |
| 5,643,367 A | | 7/1997 | Viel | 134/1 |
| 5,795,153 A | * | 8/1998 | Rechmann | 433/216 |
| RE35,981 E | | 12/1998 | Nagy et al. | 219/121.68 |
| 6,291,796 B1 | | 9/2001 | Lu et al. | 219/121.68 |
| 2001/0011545 A1 | | 8/2001 | Thompson et al. | 134/1.3 |

OTHER PUBLICATIONS

Lu et al., "Laser Removal of Particles from Magnetic Head Sliders", J. Appl. Phys 80:499–504, 1996.
Tam et al., "Laser–cleaning Techniques for Removal of Surface Particulates", J. Appl. Phys 71:3515–3523, 1992.
Wu et al., "The Modeling of Excimer Laser Particle Removal for Hydrophilic Silicon Surfaces", journal of Applied Physics 87:3618–3627, 2000.

* cited by examiner

*Primary Examiner*—Kiley Stoner
*Assistant Examiner*—Jonathan Johnson
(74) *Attorney, Agent, or Firm*—Fish & Richardson P.C.

(57) ABSTRACT

This invention relates to a method and apparatus for cleaning solid surfaces like Si substrate, disk or magnetic head slider where contaminants, including organic contaminants, especially particles in the micron or sub-micron scale are effectively remove from the solid surfaces. The invention achieves this by generating a strong laser-induced liquid jet and shock wave near the solid surfaces immersed in liquid. The liquid is a solution of water and other solvents to help reduce adhesion force and enhance cleaning efficiency.

23 Claims, 13 Drawing Sheets

METHOD AND APPARATUS FOR CLEANING SURFACES

CROSS REFERENCE TO RELATED APPLICATIONS

Pursuant to 35 USC § 119, this application claims the benefit of Singapore Patent Application No. 200204608-4 filed Jul. 31, 2002.

TECHNICAL FIELD

This invention relates to a method and apparatus for cleaning of solid surfaces, and more particularly a method and apparatus of removing micron or sub-micron size particulates on solid surfaces with the use of indirect laser irradiation.

BACKGROUND OF THE INVENTION

Laser cleaning is a relatively new technique for cleaning surfaces and may be divided into two categories, dry laser cleaning and steam laser cleaning. The following prior art discloses the details of how these laser cleaning methods are applied to remove particles on the solid surfaces: U.S. Pat. Nos. 4,980,536, 5,151,135, 5,643,367, Re35,981 and 6,291,796 B1. And U.S. published application No. 2001/0,011,545 A1.

In U.S. Pat. No. 4,980,536, small particles are removed from the solid surface like that of a silicon (Si) mask by bombardment of high-powered laser pulse. U.S. Pat. No. 5,151,135, teaches the use of short lower energy pulses of ultraviolet (UV) laser radiation on solid surfaces while U.S. Pat. No. 5,643,367, provides two stages of cleaning solid surfaces, such as a mould for making glass articles. The first stage combines the action of washing baths and ultrasound while the second stage uses a laser to impact the surface region. This second stage supplements the first stage in the cleaning process by removing left over residue. U.S. Pat. No. Re 35,981 also discloses a system for cleaning moulds, by direct laser irradiation on the surface within the mould. U.S. published application No. 2001/0011545 A1 relates to the use of laser irradiation on surfaces of semiconductor wafers or the like, where the surface is wetted with a liquid before irradiating the surface with laser with sufficient photon energy to remove the liquid and the particles on the surface. U.S. Pat. No. 6,291,796 B1, discloses an apparatus using dry laser cleaning.

In related literature, "*Laser-cleaning techniques for removal of surface particles*" (pp. 3515–3523) J. Appl. Phys. 71(7), 1992 by A. C. Tam, W. P. Leung, W. Zapka and W. Ziemlich, the action of dry laser cleaning and steam laser cleaning is disclosed. "*Laser removal of particles from magnetic head sliders*" (pp499–504) J. Appl. Phys., 80(1), 1996 by Y. F. Lu, W. D. Song, M. H. Hong, B. S. Teo, T. C. Chong and T. S. Low teaches the application of dry laser cleaning on magnetic head sliders. "*The modeling of excimer laser particle removal from hydrophilic silicon surfaces*" (pp3618–3627) J. Appl. Phys., 87(8), 2000 by X. Wu, E. Sacher and M. Meunier provides theoretical models in laser cleaning.

All the above-referenced prior art rely on pulsed laser heating of solid surfaces with or without the presence of a thin liquid coating. In dry laser cleaning, contaminants can be removed from solid surfaces by laser-induced fast thermal expansion of contaminants and/or solid surfaces or laser ablation of contaminants. In steam laser cleaning, contaminants are removed by laser-induced explosive vaporization of the liquid coating on the solid surfaces.

In both steam and dry laser cleaning, contaminants are removed from solid surfaces by laser irradiation directly onto the surfaces with or without liquid film assistance. Since most solid surfaces tend to absorb laser irradiation, the absorption induces high temperatures in the solid surfaces as the laser irradiates the solid surfaces. One problem associated with this technique is damage to the surfaces, such as oxidation, melting, ablation, crack and stress generation in the top layer of a solid substrate, and other changes of physical and chemical properties. Such changes affect the performance of the solid substrate. As mentioned in section "*A. Damage threshold*" in the publication "*Laser removal of particles from magnetic head sliders*", it was found that there is a damage threshold beyond which the substrate would experience micro-cracks after a number of heating and cooling cycles. Such substrates would have lost more than 20% of their performance as compared to a performance when they are not damaged. Therefore, it is highly desirable to have a method for laser cleaning without heating solid surfaces directly which alters the surface properties of the substrates.

SUMMARY OF THE INVENTION

The present invention is a method of cleaning solid surfaces through the use of an apparatus for the method, which focus a laser beam at a point close to the surfaces to be cleaned in a liquid medium.

In the first aspect of the present invention, an apparatus is provided, for cleaning a surface. The apparatus has a laser beam source, an optical system for focusing a laser beam from the laser beam source and a liquid in which the surface to be cleaned is immersed. The optical system is arranged in the apparatus such that the laser beam is focused at a point in the liquid, which is in close proximity to the surface to be cleaned but not directly at the surface. The apparatus also has a stage for securing the surface such that the surface can be immersed into the liquid and removed from the liquid when it is mounted on the stage. The stage can also enable the surface to be immersed fully or partially in the liquid. The stage can also move the surface horizontally in the liquid and the rate of movement of the stage is determined by the type of contaminant and/or the amount of contaminant to be removed.

The apparatus as provided in this invention can be used to clean a surface of a silicon (Si) substrate, a disk or a magnetic head slider.

In a further embodiment, the apparatus includes a filter system for filtering particles in liquid and pouring new clean mixture, liquid into container.

In yet a further preferred embodiment, the laser beam creates bubbles when it is focused at a point in the liquid. The bubbles in turn generate a laser-induced liquid jet and shock wave at the interface between bubble and solid surface to be cleaned at the moment of collapse. It is preferred that the laser beam has a pulse duration ranging from 1 nanosecond to 100 microseconds and is focused close to the surface to be cleaned. The laser source can be a YAG laser, an excimer laser, or $CO_2$ laser.

Preferably, the laser source provides a laser beam with a laser fluence in the range of 0.5 $J/cm^2$ to 100 $J/cm^2$.

Preferably, the laser beam has a frequency range from 1 Hz to 10 kHz.

Preferably, the laser beam has a pulse number from 1 to 10000 for cleaning a same position.

Preferably the laser beam has a wavelength ranging from 157 nm to 10.6 μm.

In another embodiment of the invention, a gas blower is provided to blow stray liquid spray towards the optical system and to dry the cleaned surface.

It is preferred that the apparatus has a container to hold the liquid.

In a preferred embodiment, the liquid enables the easy of the cleaning in reducing the adhesion of the particles to the substrate surface.

Preferably, the liquid in the container is pure water.

Preferably, the liquid is a mixture of water and various types of solvent.

The types of solvent can be alcohol, acetone, aromatics, ethers, ketones, alkanes, halogenated hydrocarbons or commercial washing solution which helps to reduce adhesion forces of particles on the surface to be cleaned and enhance cleaning efficiency.

In a second aspect of the invention, a method for cleaning surfaces is provided, the method includes securing a surface to be cleaned in a liquid; focusing a laser beam at a point in the liquid to generate a laser-induced liquid jet and a shock wave; and positioning the point of focus of the laser beam in close proximity to the surface to be cleaned such that the laser-induced liquid jet and shock waves clean the surface.

In a preferred embodiment, bubbles are generated in the liquid about the point of focus of the laser beam.

In yet another preferred embodiment, the bubbles collapse to generate the liquid jet and shock wave for cleaning the surface.

In one embodiment of this method, the laser beam has a pulse duration in the range from 1 nanosecond to 100 microseconds.

Preferably the laser beam is focused within a range from 0.1 mm to about 10 cm from the surface to be cleaned.

Preferably, the laser beam can be a YAG laser, an excimer laser, or $CO_2$ laser.

Preferably, the laser beam has a laser fluence in the range of 0.5 $J/cm^2$ to 100 $J/cm^2$.

Preferably, the laser beam has a frequency range from 1 Hz to 10 kHz . . .

Preferably, the laser beam has a pulse number from 1 to 10000 for cleaning a same position.

Preferably the laser beam has a wavelength ranging from 157 nm to 10.6 μm.

Preferably, the method includes blowing stray liquid spray towards the optical system and drying the cleaned surface. This is achieved by using a gas blower.

Preferably, the method further includes filtering of particles in the liquid.

In another preferred embodiment, the securing of the surface to be cleaned in the liquid is made possible by the use of a stage onto which the surface is secured. This enables the surface to move within the liquid as well as into and out of the liquid. The surface can also be immersed fully or partially in the liquid by the stage.

In another preferred embodiment, the method includes a container for holding the liquid.

Preferably the liquid is pure water.

Preferably, the liquid is a mixture of water and various types of solvent.

The types of solvent includes alcohol, acetone, aromatics, esthers, ketones, alkanes, halogenated hydrocarbons and commercial washing solutions which helps to reduce adhesion forces of particles on the surface to be cleaned and enhance cleaning efficiency.

It will be appreciated that the method of the present invention is different from dry and steam laser cleaning disclosed in the prior art as discussed in the above paragraphs. As a high power laser beam is focused into liquid, it creates a lot of bubbles there. When a solid substrate is inserted into the liquid close to the focal point where the laser beam impact the liquid, bubbles are formed at the region of the focus point of the laser beam. The interaction between the bubbles and the substrate results in bubble collapse. At the moment of bubble collapse, a shock wave is generated and a high-speed liquid jet is formed almost simultaneously. These high-speed liquid jet and shock wave create a large force causing contaminants particles to dislodge from the solid surface when it shoots towards the surface. The present invention is based on these laser-induced liquid jet and shock wave to clean solid surfaces. Since laser does not irradiate onto solid surfaces, surface damage due to thermal effects induced by laser irradiation directly onto solid surfaces in dry and steam laser cleaning can be avoided by the present invention.

With the present invention, the surface damage due to thermal effects induced by laser irradiation directly onto solid surface in prior laser cleaning methods can be avoided and contaminants especially particles and organic contaminants on solid surfaces can be effectively removed by laser-induced liquid jet and shock wave.

BRIEF DESCRIPTION OF THE DRAWINGS

The details of the present invention will become apparent by reference to the following description and accompanying drawings wherein.

DETAILED DESCRIPTION OF PREFERRED EMBODIMENT OF THE INVENTION.

Figure 1:
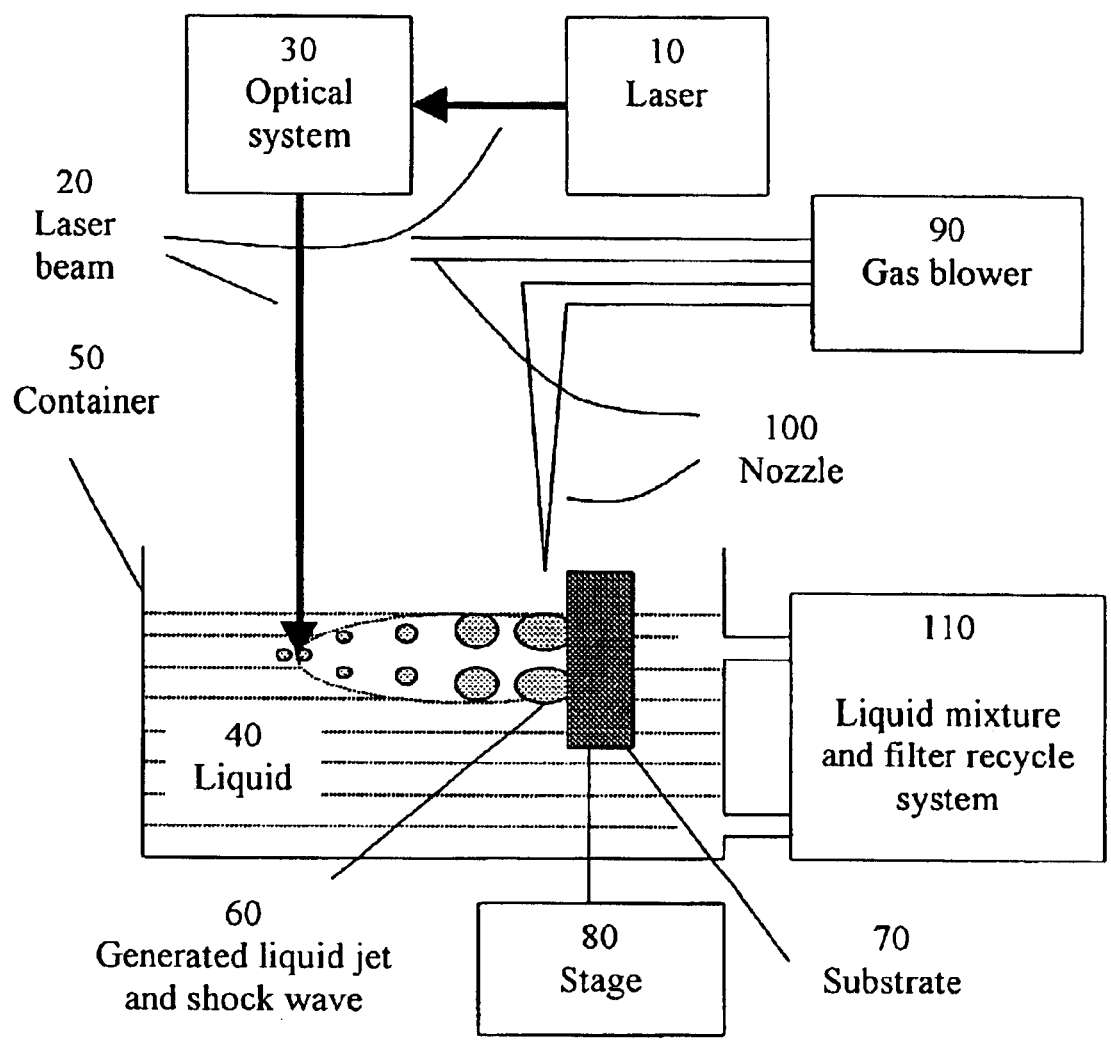
FIG. 1 is a schematic view of the apparatus for the method according to an embodiment of the present invention.

In FIG. 1, an apparatus for cleaning solid surfaces according to one embodiment of the present invention is illustrated. The apparatus comprises a laser such as an excimer or YAG laser 10 for generating laser beam 20. An optical system 30 is used to focus the laser beam 20 into a liquid 40 in a liquid container 50 to generate a laser-induced liquid jet and shock wave 60 near a substrate 70 for which the surface is to be cleaned. The substrate 70 is placed in liquid 40 at a certain distance away from laser beam focusing point. A stage 80 is used to move substrate 70 to an appropriate position in liquid 40 for cleaning and carrying substrate 70 in and out of liquid container 50. When the laser beam is focused into the liquid, some liquid, especially liquid from the liquid surface, due to the impact of the laser beam, will spray towards the optical system 30. When such stray liquid spray onto the surface of the optical components, like a lens and a mirror of the optical system 30, droplets of the liquid or a thin liquid film forms on the surface of the optical components. This may alter the optical properties such as reflectivity of the mirror and light transparency of the lens. A gas blower 90 with two nozzles 100 is used to blow the stray liquid spray away from the optical system 30. This will avoid liquid deposited on optical component surface and at the same time dry the cleaned area of the substrate out of liquid 40. A liquid mixture and filter recycle system 110 is used to filter particles in liquid 40 and pour new clean mixture liquid into liquid container 50.

Figure 2A:
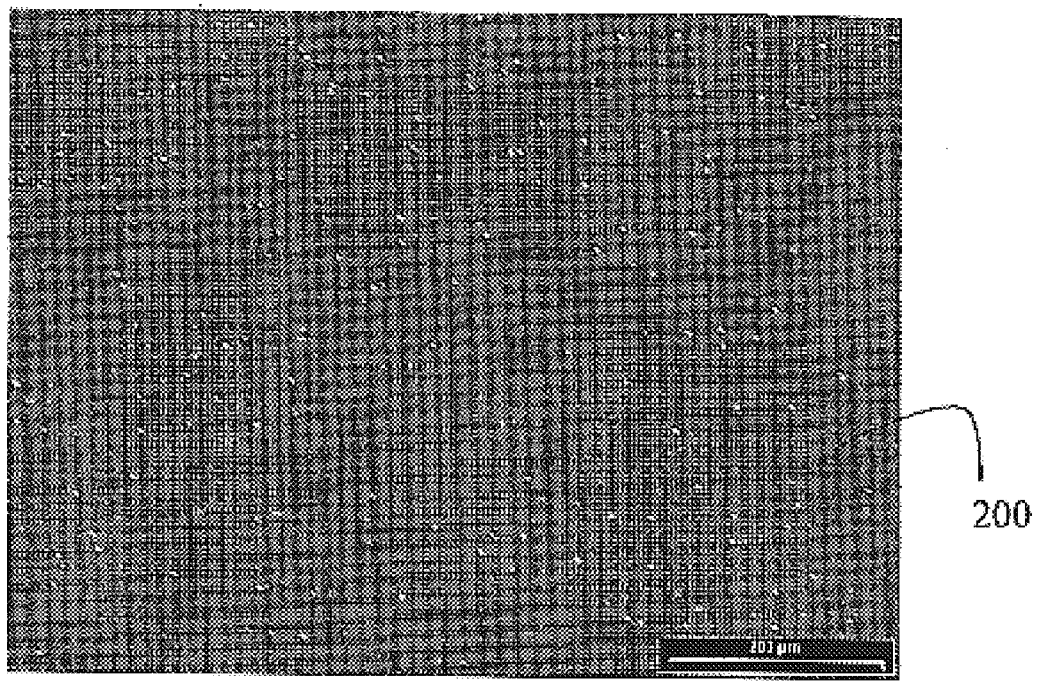
FIG. 2a is a microscopic photo showing a Si substrate with 1 μm glass particles on it before laser cleaning.
Figure 2B:
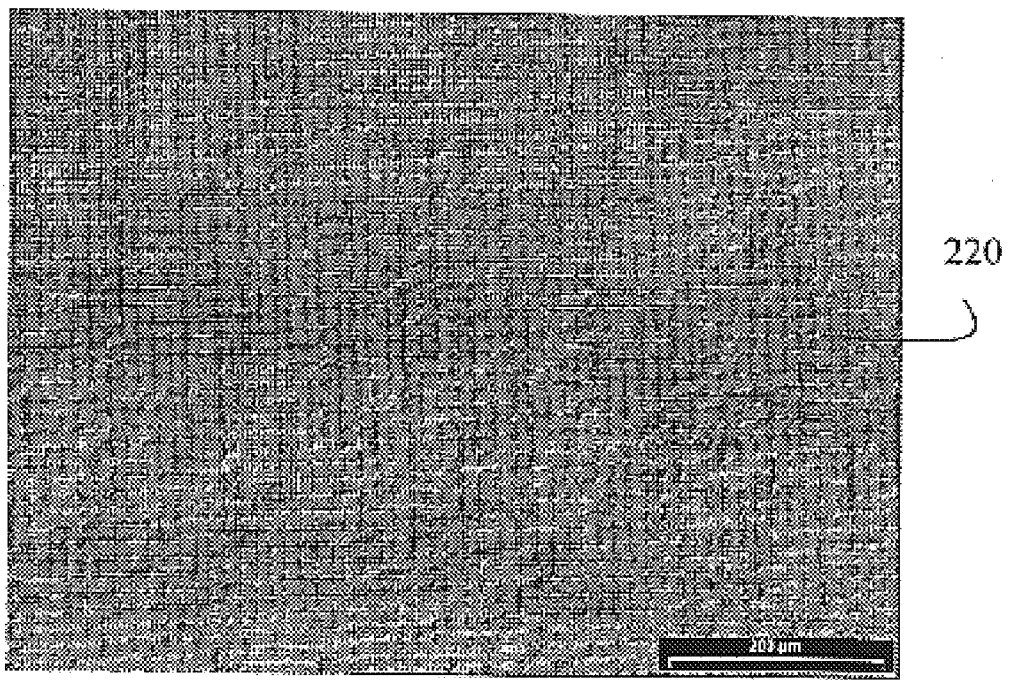
FIG. 2b is a microscopic photo showing the same Si substrate after laser cleaning by the present invention using excimer laser focusing into pure water with a wavelength of 248 nm and pulse duration of 23 ns at 10.7 $J/cm^2$ and 100 pulses.

FIGS. 2a and 2b illustrate a silicon (Si) substrate 200 before laser cleaning and a Si substrate 220 after laser cleaning according to one embodiment of the present invention. An excimer laser is used to clean Si substrate immersed in a liquid, preferably pure water. In this embodiment, the wavelength of the laser is about 248 nanometers (nm) and the pulse duration is about 23 nanoseconds (ns). The laser fluence is about 10.7 J/cm² and pulse number is about 100. The laser beam is focused at a point in the water and this point of focus is about 2 millimeters (mm) away from the Si substrate. At original area 200, glass particles of the size in 1 micrometer (μm) in diameter can be observed on Si substrate in FIG. 2a. After laser cleaning according to the present invention, the glass particles on Si substrate have been removed from the substrate 220 as shown in FIG. 2b.

Figure 3A:
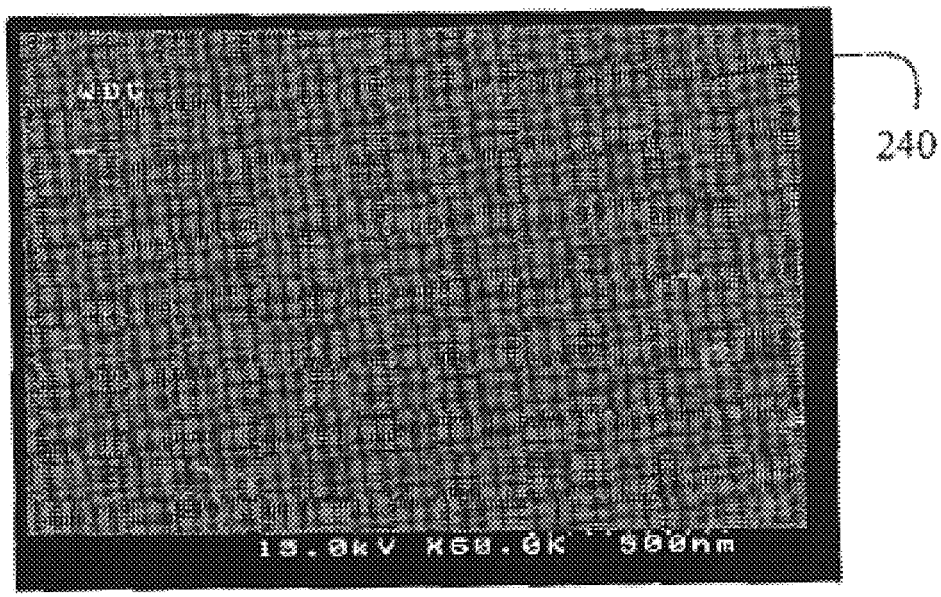
FIG. 3a is a SEM photo showing a Si substrate with 51 nm polystyrene particles on it before laser cleaning.
Figure 3B:
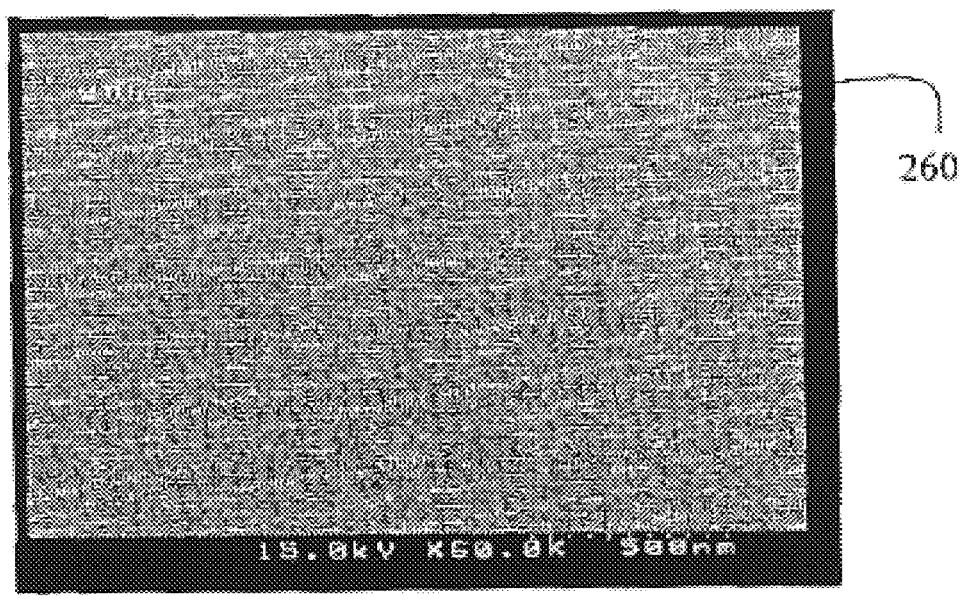
FIG. 3b is a SEM photo showing the same Si substrate after laser cleaning by present invention using excimer laser beam focusing into mixture of water and ethanol with a wavelength of 248 nm and pulse duration of 23 ns at 13.3 $J/cm^2$ and 200 pulses.
Figure 4A:
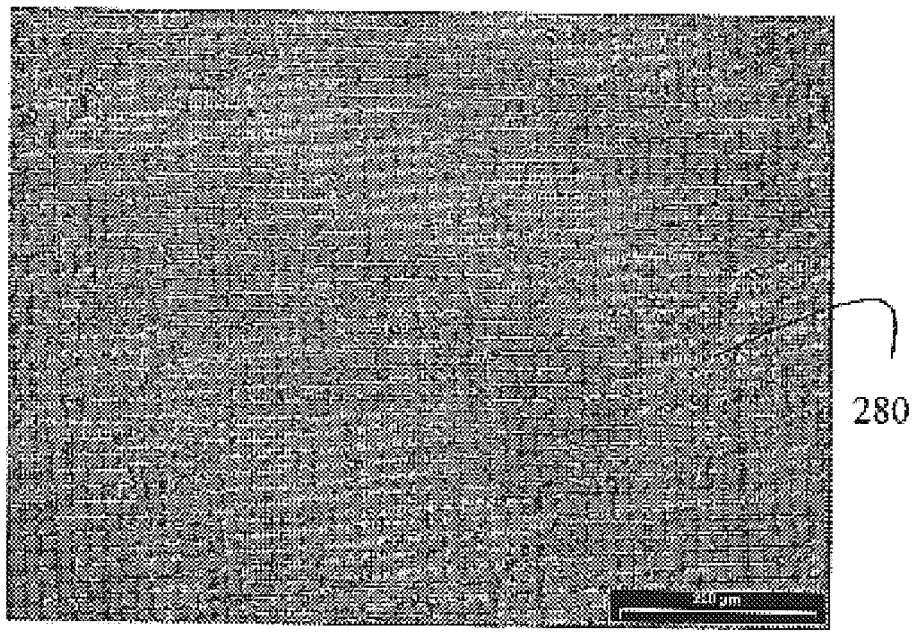
FIG. 4a is a microscope photo showing a Si substrate with 1 μm glass particles on it before laser cleaning.
Figure 4B:
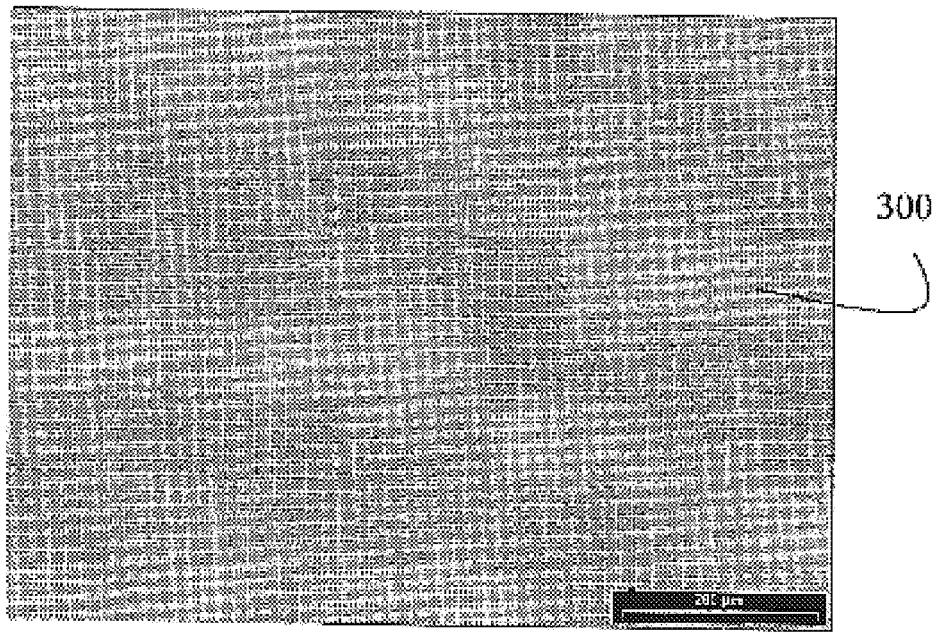
FIG. 4b is a microscope photo showing the same Si substrate after laser cleaning by present invention using YAG laser beam focusing into pure water with a wavelength of 1064 nm and pulse duration of 7 ns at 15 $J/cm^2$ and 100 pulses.

FIGS. 3a and 3b illustrate a Si substrate 240 before laser cleaning and a Si substrate 260 after laser cleaning according to the present invention. An excimer laser is used to clean the Si substrate in a mixture of water and ethanol The wavelength of the laser is about 248 nm and the pulse duration is about 23 ns The laser fluence is 13.3 J/cm² and pulse number is 200. The laser beam is focused into water surface and is emitted about 2 mm away from the Si substrate. At original area 240, a number of 51 nm polystyrene particles can be observed on Si substrate in FIG. 3a. After laser cleaning according to the present invention, the polystyrene particles on Si substrate have been removed from the substrate 260 as shown in FIG. 3b. This indicates that this invention is effective to remove tiny particles even nano-particles from solid surfaces. FIGS. 4a and 4b show a Si substrate 280 before YAG laser cleaning and a Si substrate 300 after YAG laser cleaning according to the present invention. The wavelength of the laser is about 1064 nm and the pulse duration is about 7 ns. The laser fluence is about 15 J/cm² and pulse number is about 100. The laser beam is focused into water surface and is emitted about 4 mm away from the Si substrate. At original area 280, a number of 1 μm glass particles can be observed on Si substrate in FIG. 4a. After YAG laser cleaning according to the present invention, the glass particles on Si substrate have been removed from the substrate 300 as shown in FIG. 4b.

Figure 5A:
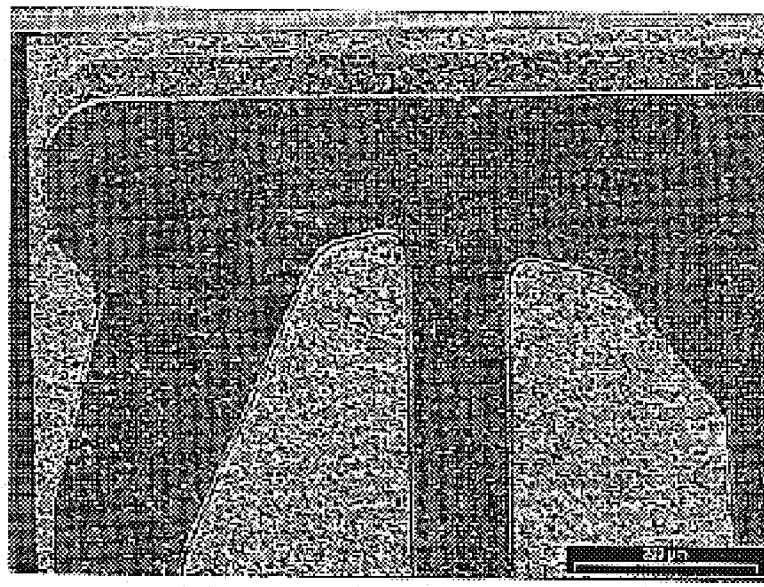
FIG. 5a is a microscope photo showing a magnetic head slider with particles generated during manufacturing before laser cleaning.
Figure 5B:
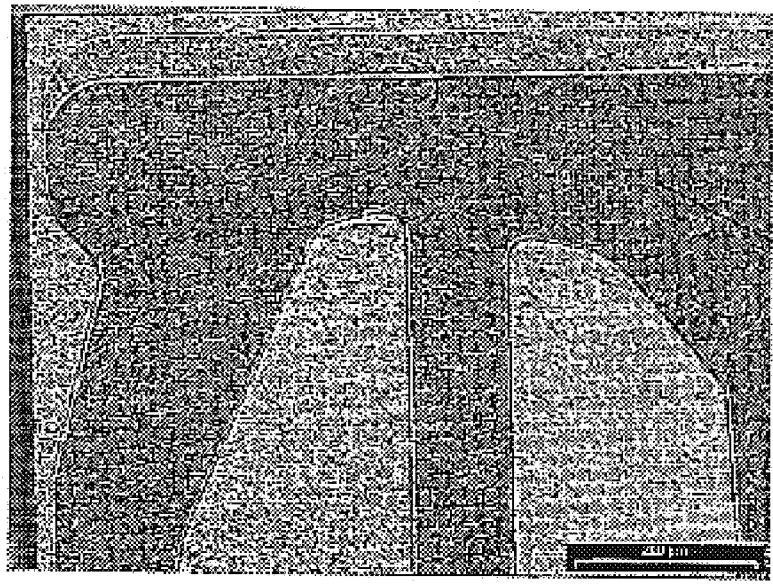
FIG. 5b is a microscope photo showing the same slider after laser cleaning by present invention using excimer laser beam focusing into pure water with a wavelength of 248 nm and pulse duration of 23 ns at 10 $J/cm^2$ and 300 pulses.

FIGS. 5a and 5b show a magnetic head slider 320 before laser cleaning and a magnetic head slider 340 after laser cleaning according to the present invention. An excimer laser is used to clean a magnetic head slider in pure water. The wavelength of the laser is about 248 nm and the pulse duration is about 23 ns. The laser fluence is about 10 J/cm² and pulse number is about 300. The laser beam is focused into water surface and is emitted about 2 mm away from magnetic head slider surface. At original area 320, particles generated during manufacturing can be observed on magnetic head slider surface in FIG. 5a. After laser cleaning according to the present invention, the particles on the slider surface have been removed from the slider 340 as shown in FIG. 5b. Therefore, the present invention can be used to remove contaminants from many kinds of solid substrates such as Si substrates, magnetic head sliders and disks.

Figure 6A:
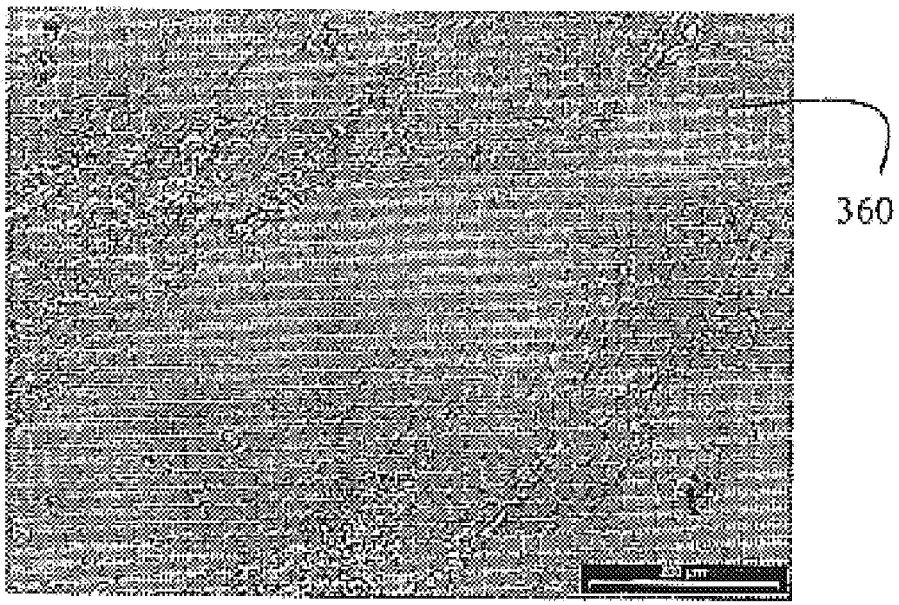
FIG. 6a is a microscope photo showing a Si substrate with a fingerprint before laser cleaning.
Figure 6B:
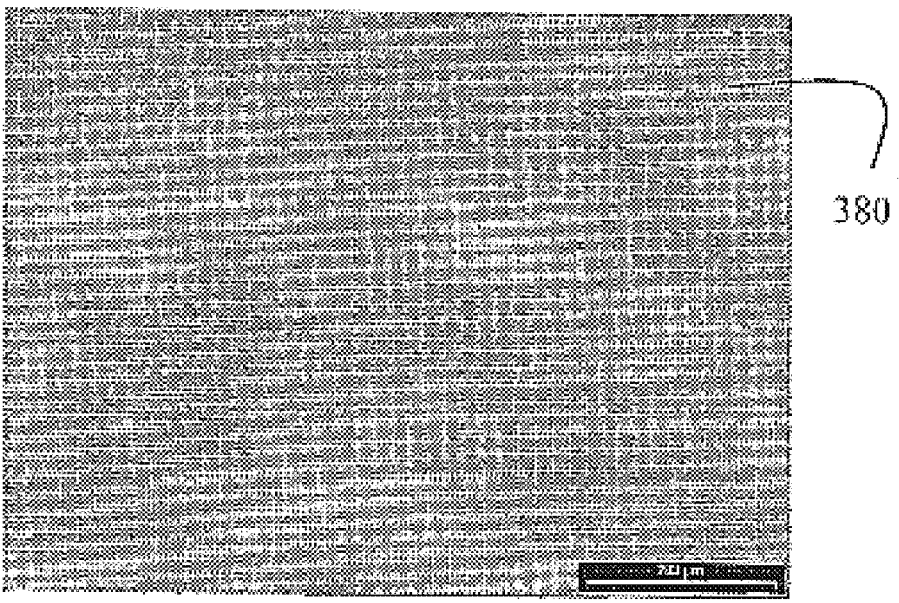
FIG. 6b is a microscope photo showing the same Si substrate after laser cleaning by present invention using excimer laser beam focusing into mixture of water and ethanol with a wavelength of 248 nm and pulse duration of 23 ns at 13.3 J/cm² and 100 pulses.

FIGS. 6a and 6b show a Si substrate before and after laser cleaning according to the present invention. An excimer laser is used to clean Si substrate in mixture of water and ethanol. The wavelength of the laser is about 248 nm and the pulse duration is about 23 ns. The laser fluence is about 13.3 J/cm$^2$ and pulse number is about 100. The laser beam is focused into water surface and is emitted about 2 mm away from the Si substrate. At original area 360, a fingerprint can be observed on the Si substrate in FIG. 6a. After laser cleaning according to the present invention, the fingerprint on Si substrate has been removed from the substrate 380 as shown in FIG. 6b. Therefore, in one embodiment, the present invention may be used to remove grease and other organic contaminants from solid surfaces.

Figure 7A:
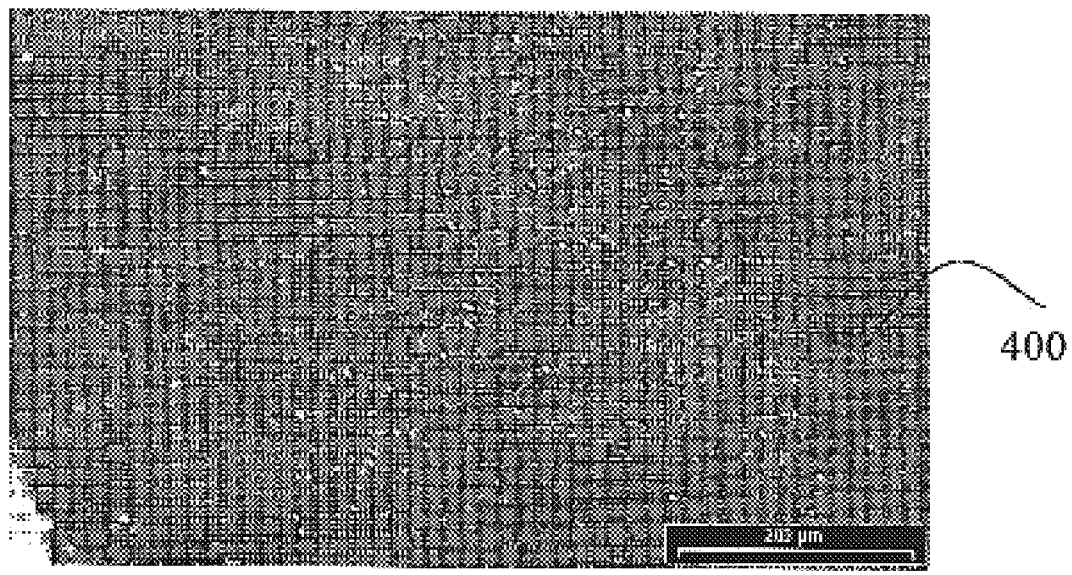
FIG. 7a is a microscope photo showing a Si substrate with tiny particles on it after 1 hour's ultrasonic cleaning.
Figure 7B:
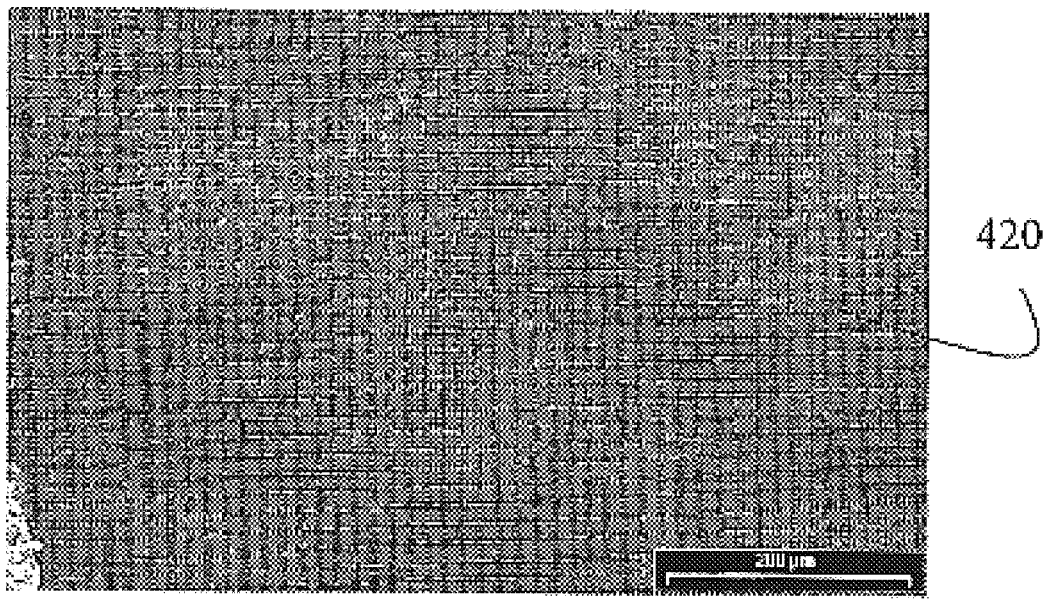
FIG. 7b is a microscope photo showing the same Si substrate after laser cleaning by present invention using excimer laser beam focusing into pure water with a wavelength of 248 nm and pulse duration of 23 ns at 10 J/cm² and 100 pulses.

FIG. 7a is a microscope photo showing a Si substrate after an hour of ultrasonic cleaning. However, even after the ultrasonic cleaning, many tiny particles were not removed from the surface 400. FIG. 7b shows the same Si substrate after laser cleaning according to the present invention. An excimer laser was used to clean the substrate in pure water. The wavelength of the laser is about 248 nm and the pulse duration is about 23 ns. The laser fluence is about 10 J/cm$^2$ and pulse number is about 100. The laser beam is focused into water surface and is emitted 2 mm away from Si substrate. After laser cleaning according to the present invention, the particles have been removed from the Si substrate 420 as shown in FIG. 7b. Therefore, the present invention is very efficient cleaning method as compared to ultrasonic cleaning.

Figure 8A:
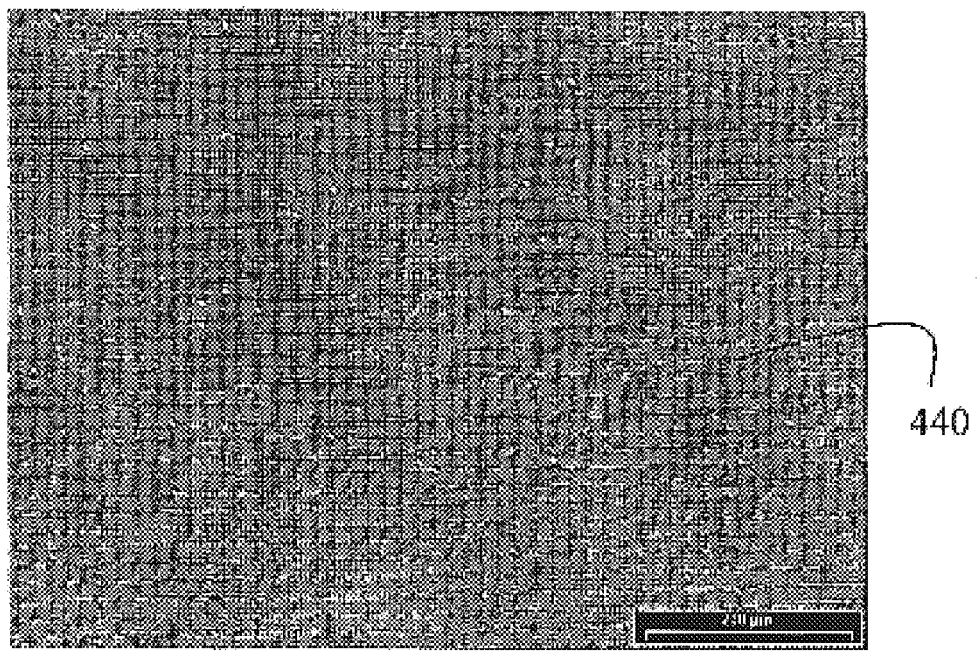
FIG. 8a is a microscope photo showing a Si substrate with 1 μm glass particles on it before laser cleaning.
Figure 8B:
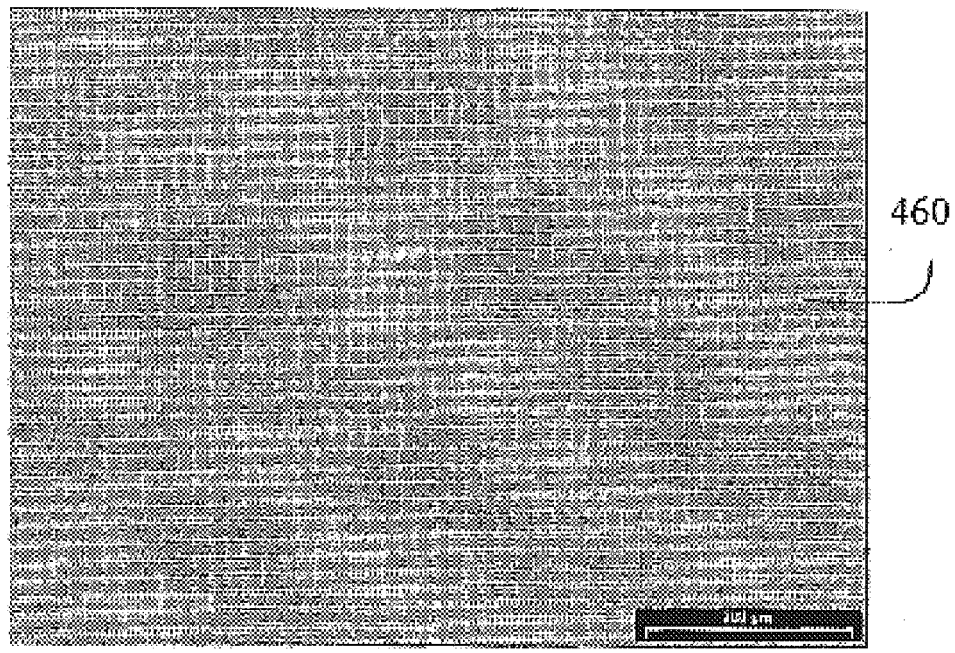
FIG. 8b is a microscope photo showing the same Si substrate after laser cleaning by present invention using excimer laser beam focusing into liquid with a mixture of water and ethanol with a wavelength of 248 nm and pulse duration of 23 ns at 5.7 J/cm² and 50 pulses.

FIGS. 8a and 8b show a Si substrate before and after laser cleaning in a liquid having a mixture of water and ethanol according to the present invention. An excimer laser is used to clean Si substrate in the liquid. The wavelength of the laser is 248 nm and the pulse duration is about 23 ns. The laser fluence is about 5.7 J/cm$^2$ and pulse number is about 50. The laser beam is focused into the liquid surface and is emitted about 2 mm away from the Si substrate. At original area 440, a number of 1 µm glass particles can be observed on Si substrate in FIG. 8a. After laser cleaning according to the present invention, the glass particles on Si substrate have been removed from the substrate 460 as shown in FIG. 8b. After comparing cleaning conditions in FIG. 2 and FIG. 8, it was found that by adding ethanol into water, the adhesion force of the particles to the Si substrate surface is reduced allowing the particles to be removed at lower laser fluence and pulses. Therefore the addition of ethanol enhances cleaning efficiency.

Figure 9:
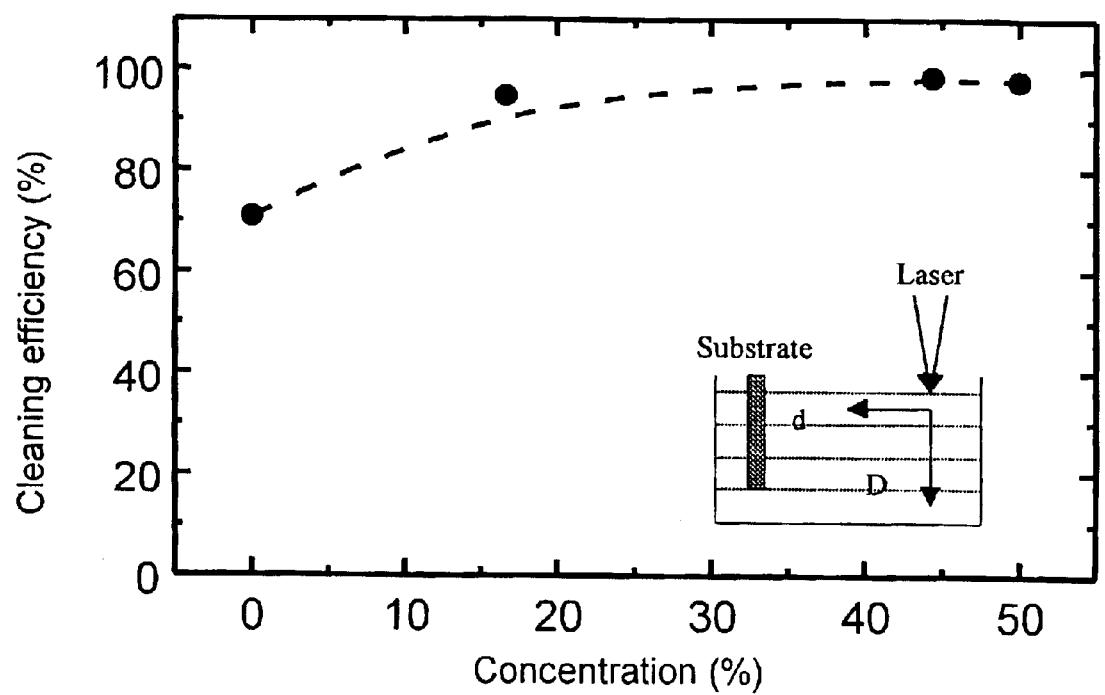
FIG. 9 is a graph illustrating the cleaning efficiency of the method of the present invention with respect to the concentration of ethanol in water.

FIG. 9 shows the effect of having ethanol in water in accordance with one embodiment of the invention. The excimer laser, with a wavelength of 248 nm at a frequency of 2 Hz for the pulse duration of 23 ns where the pulse number is 50, is focused into a mixture of ethanol and water where the laser fluence being set at 5.7 J/cm$^2$. The point of focus into the ethanol and water mixture was at a distance, d=2 mm from a substrate surface and the depth of the focus, D=0 mm from the surface of the ethanol and water mixture. It was found that cleaning efficiency for cleaning a (Si) substrate surface of glass particles of the size of 1 µm in diameter increases with an increase in the concentration of ethanol in water. The cleaning efficiency reaches an optimum when the concentration of ethanol reaches about 30% in water.

Figure 10A:
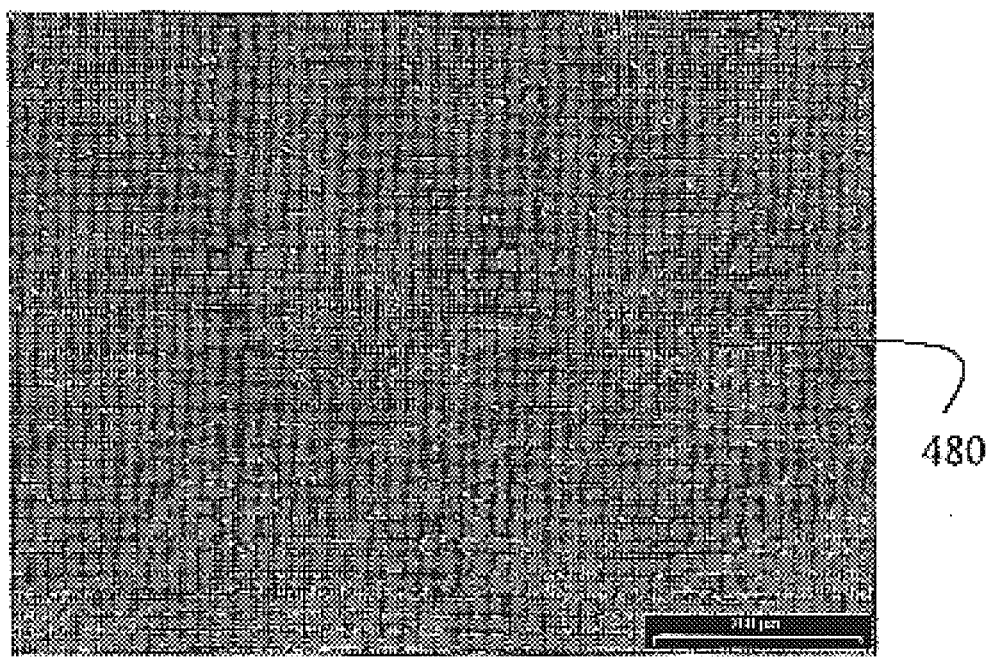
FIG. 10a is a microscope photo showing a Si substrate with 1 μm glass particles on it before laser cleaning.
Figure 10B:
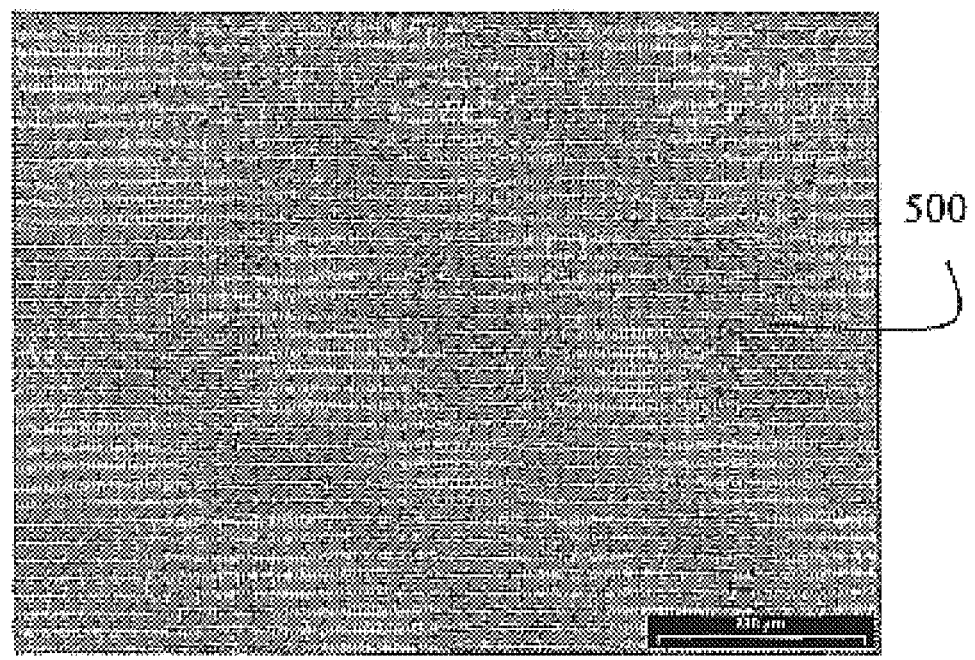
FIG. 10b is a microscope photo showing the same Si substrate after laser cleaning by present invention using excimer laser beam focusing into liquid with a mixture of water and commercial washing solution with a wavelength of 248 nm and pulse duration of 23 ns at 5.7 J/cm² and 50 pulses.

FIGS. 10a and 10b show a Si substrate before and after laser cleaning in liquid with a mixture of water and commercial washing solution according to the present invention. An excimer laser was used to clean Si substrate in the liquid. The wavelength of the laser is about 248 nm and the pulse duration is about 23 ns. The laser fluence is about 5.7 J/cm$^2$ and pulse number is about 50. The laser beam is focused into the liquid surface and is emitted about 2 mm away from the Si substrate. At original area 480, a number of 1 µm glass particles can be observed on Si substrate in FIG. 10a. After laser cleaning according to the present invention, the glass particles have been removed from the Si substrate 500 as shown in FIG. 10b. Comparing cleaning conditions in FIG. 2 and FIGS. 10a and 10b, it is also found that the particles can be removed at lower laser fluence and pulses by adding some commercial washing solution into water which reduces the adhesion force and enhances cleaning efficiency.

Figure 11:
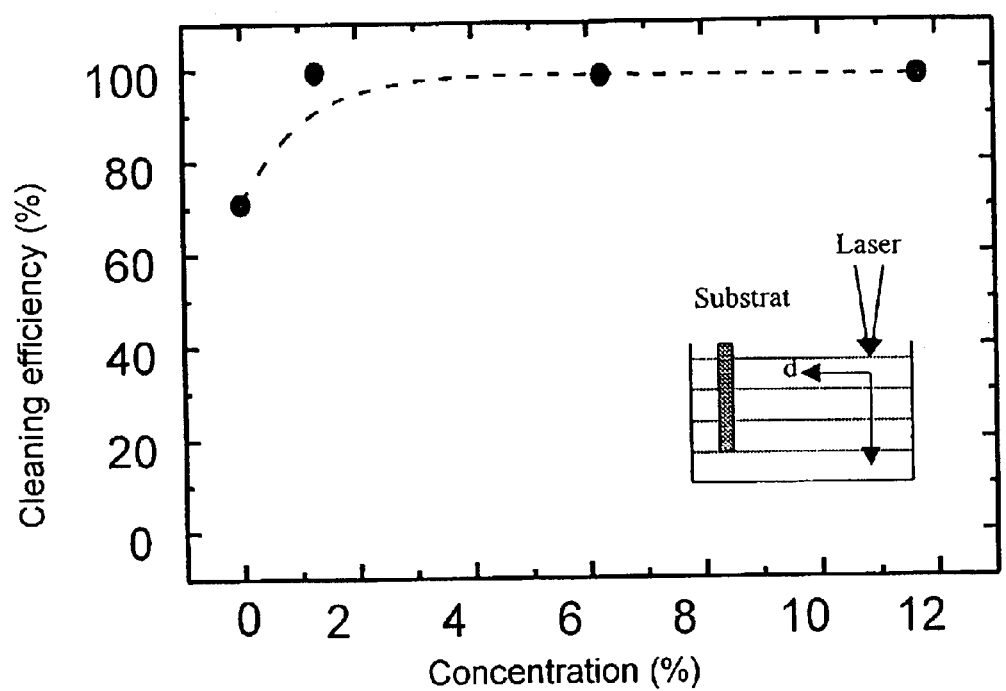
FIG. 11 is a graph illustrating the cleaning efficiency of the method of the present invention with respect to the concentration of washing solution in water.

FIG. 11 shows the effect of having commercial washing solution added to water in accordance to one embodiment of the present invention. The excimer laser, with a wavelength of 248 nm at a frequency of 2 Hz for the pulse duration of 23 ns where the pulse number is 50 is focused into a mixture of water and washing solution, where the laser fluence was set at 5.7 J/cm$^2$. The laser beam was focused at a distance, d=2 mm and at a depth, D=0 mm from the surface of the commercial washing solution mixture. It was found that higher cleaning efficiency for a silicon (Si) substrate of glass particles of the size of 1 µm in diameter can be achieved with an increase in the concentration of washing solution in water.

Figure 12:
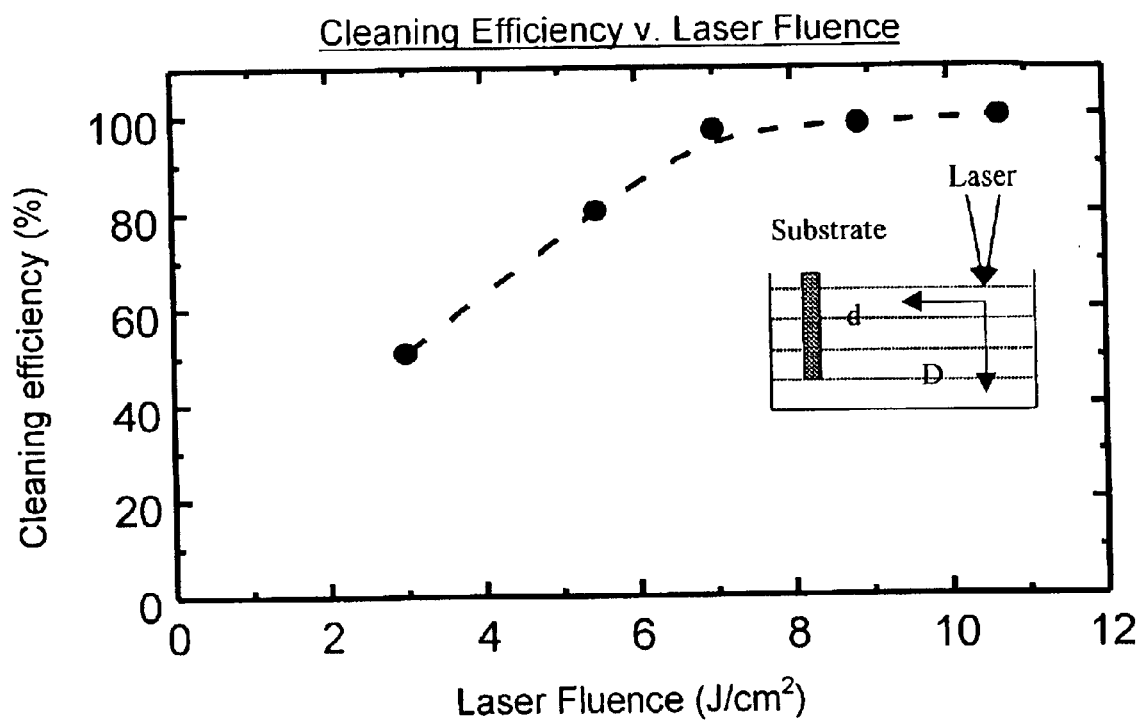
FIG. 12 is a graph illustrating the cleaning efficiency of the method of the present invention with respect to change in laser fluence.

FIG. 12 shows the effect of varying laser fluence in accordance with one embodiment of the present invention. The following parameters were fixed in an excimer laser which was focused at a point in water: a wavelength of 248 nm at a frequency of 10 Hz for the pulse duration of 23 ns where the pulse number is 100. The surface to be cleaned is that of a silicon (Si) substrate where glass particles of the size of 1 µm are to be removed. The Si substrate is immersed in the water. The laser beam was focused at a point where the distance from a substrate surface, d=2 mm and where the depth from the water surface, D=0 mm. When the cleaning efficiency was monitored with the change in laser fluence, it was found that cleaning efficiency increases with an increase of laser fluence.

Figure 13:
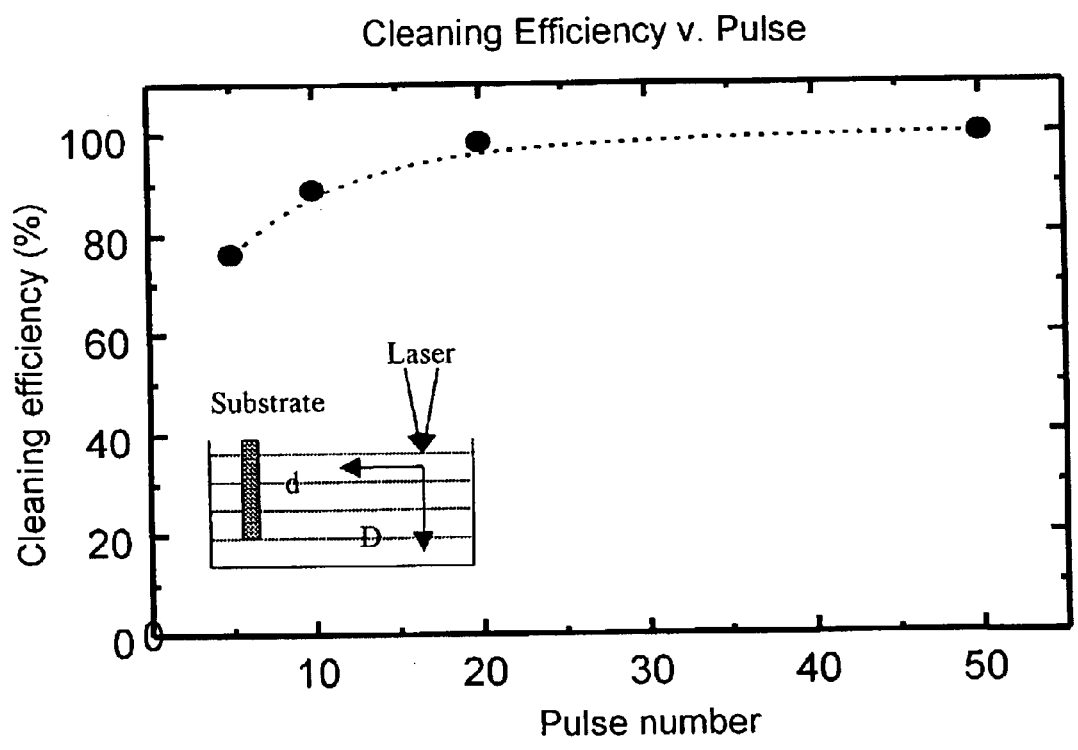
FIG. 13 is a graph illustrating the cleaning efficiency of the method of the present invention with respect to change in pulse number.

FIG. 13 shows the effect of varying the pulse number in accordance with one embodiment of the present invention. As described above with respect to FIG. 12, the wavelength, and pulse duration, distance, d and depth, D were kept constant and the laser fluence set to 10.7 J/cm$^2$. The frequency is set to 1 Hz. The surface to be cleaned being that of a silicon (Si) substrate where glass particles of the size of 1 µm in diameter are to be removed. As illustrated in FIG. 13, the cleaning efficiency increases with the pulse number.

Figure 14:
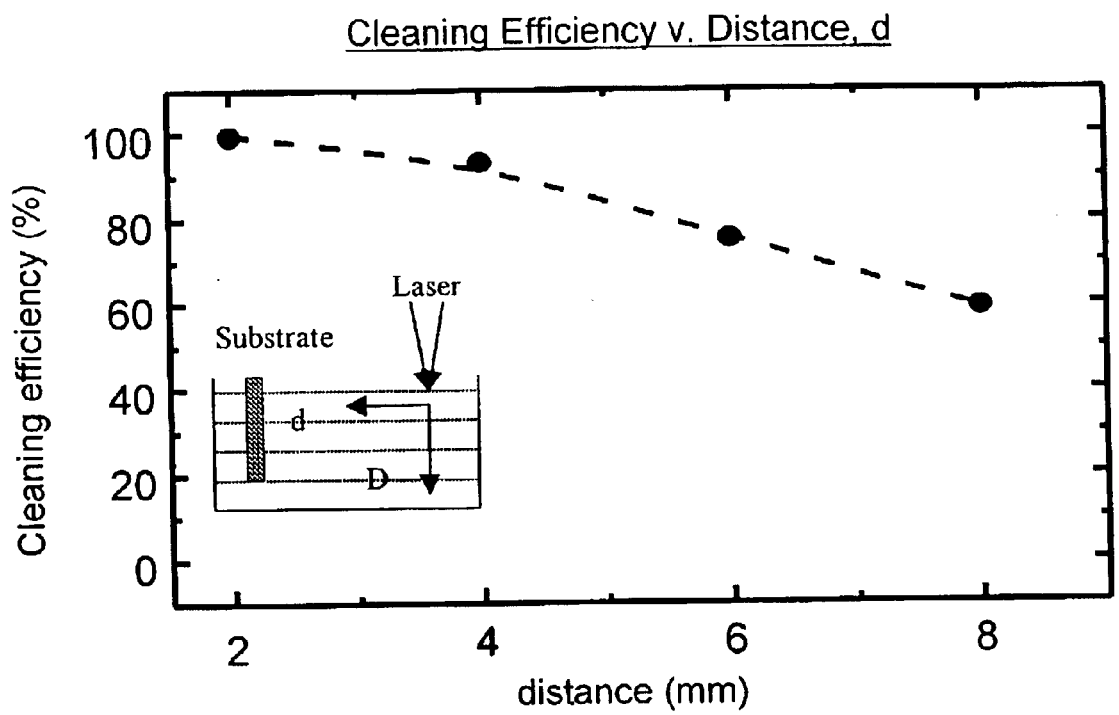
FIG. 14 is a graph illustrating the cleaning efficiency of the method of the present invention with respect to distance, d, from the substrate surface.

In addition, it was also found that cleaning efficiency decreases with an increase of distance, d, between substrate surface and focal point of the laser beam. This is illustrated in FIG. 14, which is a graph illustrating the effect of varying distance in accordance with one embodiment of the present invention. The laser used is excimer laser at a wavelength of 248 nm and pulse duration of 23 ns at a frequency of 10 Hz. The pulse number at 100 pulses and laser fluence at 13.5 mJ/cm$^2$ with Si substrate in water where the particle to be cleaned are glass particles of size 1 µm in diameter. The depth, D=0 mm from the water surface.

Figure 15:
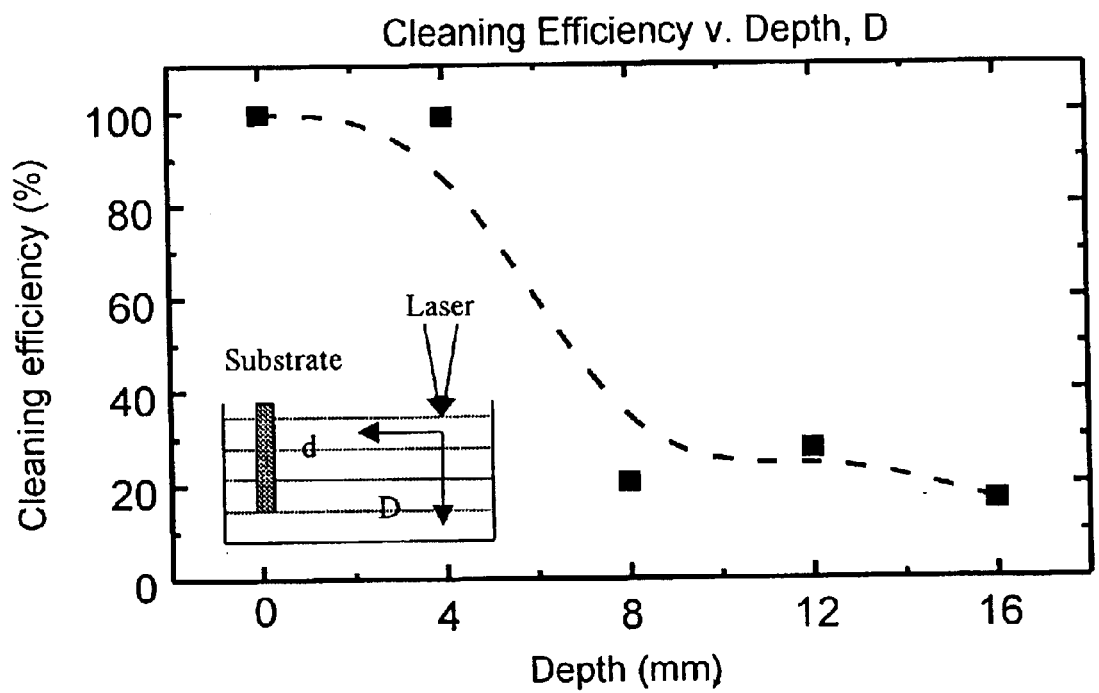
FIG. 15 is a graph illustrating the cleaning efficiency of the method of the present invention with respect to the depth, D, from the surface of the liquid.

FIG. 15 shows the effect of varying depth in accordance with one embodiment of the present invention. The excimer laser set at a wavelength of 248 nm, pulse duration of 23 ns at a frequency of 10 Hz. The pulse number 100 and laser fluence at 10.7 J/cm$^2$. The distance, d=2 mm from the Si substrate, to clean glass particles of the size 1 µm in diameter. As illustrated, the cleaning efficiency decreases with an increase in the depth, D, of the point of focus of the laser from the surface of the water, where all other parameters are kept constant.

From the results shown in FIGS. 12, 13, 14 and 15, the cleaning efficiency of the present invention increases with an increase of laser fluence or pulse number and decreases with an increase of distance between substrate surface and laser beam focus point or depth below liquid surface. Many kinds of lasers such as excimer laser and YAG laser are able to generate a strong laser-induced liquid jet and shock wave in liquid and can therefore be used in the present invention. The present invention can be used to remove contaminants, especially tiny particles and organic contaminants, from many different types of solid substrates, such as Si substrate, magnetic head slider and disks. The liquid used in the present invention is preferably water or mixture of water and other solvents, such as alcohol, acetone and commercial washing solution, that help to reduce adhesion force and enhance cleaning efficiency. A high cleaning efficiency can be obtained by adding these solvents into water in the present invention.

In summary, the present invention is a significant improvement over dry and steam laser cleaning. Focusing a high powered laser beam into a liquid creates bubbles in the liquid. As the bubbles move towards a solid surface to be cleaned, a shock wave is generated at the moment of bubble collapse and a high-speed liquid jet is formed during bubble collapse due to bubble and surface boundary interaction. The laser-induced high-speed liquid jet and shock wave effectively remove contaminants on the solid surfaces. Since the laser does not irradiate onto the solid surfaces, surface damage due to thermal effects induced by laser irradiation in dry and steam laser cleaning can be avoided by the present invention.

Various other embodiments of the invention provide advantages complimentary to those already described without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

We claim:

1. A method for cleaning surfaces, the method comprising:
   filling a container with liquid;
   securing a surface to be cleaned in the container with liquid;
   focusing a laser beam at a point in the liquid to generate a liquid jet and a shock wave;
   positioning the point of focus of the laser beam in close proximity to the surface to be cleaned such that the laser-induced liquid jet and shock wave clean the surface.

2. The method according to claim 1, wherein bubbles are generated about the point of focus of the laser beam in the liquid.

3. The method according to claim 2, wherein the laser beam is focused from about 0.1 mm to about 10 cm from the surface.

4. The method according to claim 3, wherein the bubbles collapse to generate the liquid jet and shock wave for cleaning at the surface.

5. The method according to claim 1, wherein the laser beam has a pulse duration in the range of 1 nanosecond to 100 microseconds.

6. The method according to claim 1, wherein the laser beam is one of a group consisting a YAG laser, an excimer laser and $CO_2$ laser.

7. The method according to claim 6, wherein the laser beam has a laser fluence in the range of 0.5 $J/cm^2$ to 100 $J/cm^2$.

8. The method according to claim 6, wherein the laser beam has a frequency in the range of 1 Hz to 10 kHz.

9. The method according to claim 6 wherein the laser beam has a pulse number which range from 1 to 10000 for cleaning a same position.

10. The method according to claim 6, wherein the laser beam has a wavelength in the range of 157 nm to 10.6 µm.

11. The method according to claim 1 further comprising blowing stray liquid spray and drying the cleaned surface.

12. The method according to claim 1 further comprises filtering particles from the liquid.

13. The method according to claim 3, wherein a stage is provided to secure the surface.

14. The method according to claim 13, wherein the surface to be cleaned can be moved into and out of the liquid.

15. The method according to claim 13, wherein the surface can be moved within the liquid.

16. The method of claim 13, wherein the stage can move the surface in a horizontal direction in the liquid.

17. The method of claim 13, wherein the stage can move the surface in a vertical direction in the liquid.

18. The method of claim 16 wherein the stage can move the surface in vertical direction.

19. The method according to claim 11, wherein a gas blower is provided for blowing stray liquid spray and drying the cleaned surface.

20. The method according to claim 1, wherein the liquid reduces adhesion forces of particles on the surface to be cleaned and enhance cleaning efficiency.

21. The method according to claim 20, wherein the liquid is pure water.

22. The method according to claim 20, wherein the liquid is a mixture of water and a solvent.

23. The method according to claim 22, wherein the solvent is one of a group consisting alcohols, aromatics, ethers, ketones, alkanes, halogenated hydrocarbons and commercial washing solution.

* * * * *